(12) United States Patent
Radkov (10) Patent No.: US 7,768,189 B2
(45) Date of Patent: Aug. 3, 2010

(54) WHITE LEDS WITH TUNABLE CRI

(75) Inventor: Emil Radkov, Euclid, OH (US)

(73) Assignee: Lumination LLC, Cleveland, OH (US)

( * ) Notice: Subject to any disclaimer, the term of this patent is extended or adjusted under 35 U.S.C. 154(b) by 432 days.

(21) Appl. No.: 10/909,564

(22) Filed: Aug. 2, 2004

(65) Prior Publication Data
US 2006/0022582 A1    Feb. 2, 2006

(51) Int. Cl.
*H01J 1/62* (2006.01)
*H01J 63/04* (2006.01)

(52) U.S. Cl. .................. 313/487; 313/486; 445/224

(58) Field of Classification Search ......... 313/498–512, 313/486, 487
See application file for complete search history.

(56) References Cited

U.S. PATENT DOCUMENTS

| | | | |
|---|---|---|---|
| 6,351,069 B1 | 2/2002 | Lowery et al. | |
| 6,538,371 B1 | 3/2003 | Duggal et al. | |
| 6,680,569 B2 | 1/2004 | Mueller-Mach et al. | |
| 6,717,353 B1 | 4/2004 | Mueller et al. | |
| 6,720,584 B2 | 4/2004 | Hata et al. | |
| 2002/0158565 A1 | 10/2002 | Setlur | |
| 2003/0067008 A1 | 4/2003 | Srivastava et al. | |
| 2004/0000862 A1 | 1/2004 | Setlur et al. | |
| 2005/0029927 A1 | 2/2005 | Setlur et al. | |
| 2006/0022582 A1 | 2/2006 | Radkov | |

FOREIGN PATENT DOCUMENTS

| | | |
|---|---|---|
| EP | 1 138 747 A2 | 10/2001 |
| GB | A-2 347 018 | 8/2000 |
| GB | 2405409 | 3/2005 |
| WO | WO 0189001 | 11/2001 |
| WO | WO 2005/004202 | 1/2005 |

OTHER PUBLICATIONS

Y. Ohno, "Color Rendering and Luminous Efficacy of White LED Spectra", Proc. SPIE Solid State Lighting Conference, Aug. 3-5, 2004, Denver.

*Primary Examiner*—Bumsuk Won
(74) *Attorney, Agent, or Firm*—Fay Sharpe LLP (57) ABSTRACT

A method for the manufacturing of white LEDs is proposed, which can achieve a tunable color rendering index (CRI) or luminosity through the use of at least two phosphor composition layers of essentially the same emission color coordinates, each composition including at least one individual phosphor compound. The method allows to optimize the devices for CRI at a given minimal luminosity requirement, or vice versa.

22 Claims, 11 Drawing Sheets

WHITE LEDS WITH TUNABLE CRI

BACKGROUND OF THE INVENTION

The present exemplary embodiments relate to phosphors for the conversion of radiation emitted by a light source. They find particular application in conjunction with converting LED-generated ultraviolet (UV), violet or blue radiation into white light for general illumination purposes. It should be appreciated, however, that the invention is also applicable to the conversion of radiation from UV, violet and/or blue lasers as well as other light sources to white light.

Light emitting diodes (LEDs) are semiconductor light emitters often used as a replacement for other light sources, such as incandescent lamps. They are particularly useful as display lights, warning lights and indicating lights or in other applications where colored light is desired. The color of light produced by an LED is dependent on the type of semiconductor material used in its manufacture.

Colored semiconductor light emitting devices, including light emitting diodes and lasers (both are generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n and p type dopants to improve properties, such as light emission efficiency. With reference to the GaN-based LEDs, light is generally emitted in the UV and/or blue range of the electromagnetic spectrum. Until quite recently, LEDs have not been suitable for lighting uses where a bright white light is needed, due to the inherent color of the light produced by the LED.

Recently, techniques have been developed for converting the light emitted from LEDs to useful light for illumination purposes. In one technique, the LED is coated or covered with a phosphor layer. A phosphor is a luminescent material that absorbs radiation energy in a portion of the electromagnetic spectrum and emits energy in another portion of the electromagnetic spectrum. Phosphors of one important class are crystalline inorganic compounds of very high chemical purity and of controlled composition to which small quantities of other elements (called "activators") have been added to convert them into efficient fluorescent materials. With the right combination of activators and host inorganic compounds, the color of the emission can be controlled. Most useful and well-known phosphors emit radiation in the visible portion of the electromagnetic spectrum in response to excitation by electromagnetic radiation outside the visible range.

By interposing a phosphor excited by the radiation generated by the LED, light of a different wavelength, e.g., in the visible range of the spectrum, may be generated. Colored LEDs are often used in toys, indicator lights and other devices. Manufacturers are continuously looking for new colored phosphors for use in such LEDs to produce custom colors and higher luminosity.

In addition to colored LEDs, a combination of LED generated light and phosphor generated light may be used to produce white light. The most popular white LEDs are based on blue emitting GaInN chips. The blue emitting chips are coated with a phosphor that converts some of the blue radiation to a complementary color, e.g. a yellow-green emission. The total of the light from the phosphor and the LED chip provides a color point with corresponding color coordinates (x and y on the CIE chromaticity diagram) and correlated color temperature (CCT), and its spectral distribution provides a color rendering capability, measured by the color rendering index (CRI).

The CRI is commonly defined as a mean value for 8 standard color samples ($R_{1-8}$), usually referred to as the General Color Rendering Index and abbreviated as $R_a$, although 14 standard color samples are specified internationally and one can calculate a broader CRI ($R_{1-14}$) as their mean value. In particular, the $R_9$ value, measuring the color rendering for the strong red, is very important for a range of applications, especially of medical nature. As used herein, "CRI" is used to refer to any of the above general, mean, or special values unless otherwise specified.

One known white light emitting device comprises a blue light-emitting LED having a peak emission wavelength in the blue range (from about 440 nm to about 480 nm) combined with a phosphor, such as cerium doped yttrium aluminum garnet $Y_3Al_5O_{12}$: $Ce^{3+}$ ("YAG"). The phosphor absorbs a portion of the radiation emitted from the LED and converts the absorbed radiation to a yellow-green light. The remainder of the blue light emitted by the LED is transmitted through the phosphor and is mixed with the yellow light emitted by the phosphor. A viewer perceives the mixture of blue and yellow light as a white light.

So far, it has been extremely difficult to fine-tune the CRI of a phosphor-converted white light LED around given color point and luminous efficacy targets. As detailed above, previously proposed methods of white LED manufacturing use either a single phosphor composition (containing 1 or more phosphor compounds), or a layered structure of phosphor compositions, each with a substantially different color point, providing a color balance.

Figure 1:
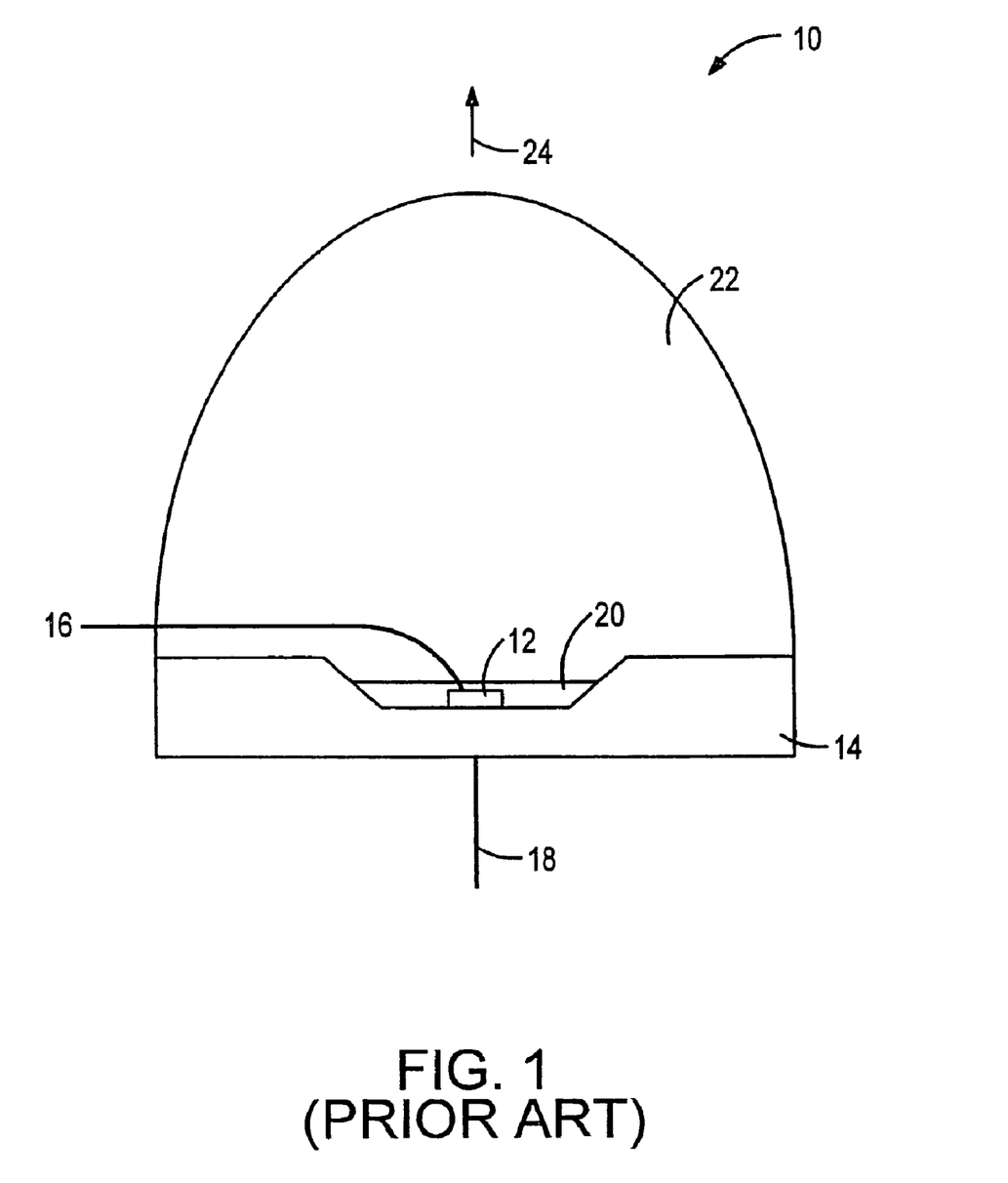
FIG. 1 is a schematic cross-sectional view of a prior art phosphor converted LED illumination system.

In this respect, attention is directed to FIG. 1, which shows an exemplary phosphor conversion light emitting device 10 as shown. The light emitting device 10 comprises a semiconductor UV or blue radiation source, such as a light emitting diode (LED) chip or die 12 and leads 16, 18 electrically attached to the LED chip. The leads may comprise thin wires supported by a thicker lead frame(s) 14 or the leads may comprise self supported electrodes and the lead frame may be omitted. The leads 16, 18 provide current to the LED chip 12 and thus cause the LED chip 12 to emit radiation. The chip 12 is covered by a phosphor containing layer 20. The phosphor material utilized in the layer 20 can vary, depending upon the desired color of secondary light that will be generated by the layer 20. The chip 12 and the phosphor containing layer 20 are encapsulated by an encapsulant 22.

In operation, electrical power is supplied to the die 12 to activate it. When activated, the chip 12 emits the primary light away from its top surface. The emitted primary light is absorbed by the phosphor containing layer 20. The phosphor layer 20 then emits a secondary light, i.e., converted light having a longer peak wavelength, in response to absorption of the primary light. The secondary light is emitted randomly in various directions by the phosphor in the layer 20. Some of the secondary light is emitted away from the die 12, propagating through the encapsulant 22 and exiting the device 10 as output light. The encapsulant 22 directs the output light in a general direction indicated by arrow 24.

Both the single phosphor composition (containing 1 or more phosphor compounds) approach and the layered structure of phosphor compositions (each with a substantially different color point) approach, provides a given set of luminosity and CRI values which are fixed either by the chemical composition or the relative size of the phosphor layers, and cannot be changed further without either redesigning the phosphor blend or losing the color balance of the device.

It would therefore be desirable to develop new LED based solutions that allow tuning the CRI (e.g. maximizing for a given minimal luminosity requirement) or the luminosity (e.g. maximizing for a given minimal CRI requirement) without affecting the chemical composition of the phosphor blend or compromising the color point target. This affords a set of 2 basic phosphor compositions to be used for the manufacturing of white LEDs with the same color point but with CRI or luminosity values customized for specific applications. The present invention provides new and improved phosphor layering methods, blends and method of formation, which overcome the above-referenced problems and others.

SUMMARY OF THE INVENTION

In a first aspect, there is provided a lighting apparatus for emitting white light including a semiconductor light source emitting radiation with a peak at from about 250 nm to about 500 nm; a first phosphor composition; and a second phosphor composition; wherein the first and second phosphor compositions have substantially the same emission color coordinates when subjected to the same source excitation radiation.

In a second aspect, there is provided a method for making a lighting apparatus for emitting white light which can achieve a tunable color rendering index (CRI) and luminosity, the method including the steps of providing a semiconductor light source emitting radiation having a peak emission at from about 250 to 500 nm; providing a first phosphor composition radiationally coupled to the light source; and providing a second phosphor composition disposed on top of the first phosphor layer; wherein the first and second phosphor compositions have substantially the same emission color coordinates when subjected to the same source excitation radiation.

DETAILED DESCRIPTION OF THE PREFERRED EMBODIMENTS

Novel phosphor lay-down strategies are presented herein as well as their use in LED and other light sources. The color of the generated visible light is dependent on the particular makeup of the phosphor materials. As used herein, the term "phosphor composition" may be used to denote both a single phosphor compound as well as a blend of two or more phosphor compounds, depending on the embodiment, unless otherwise noted.

It was determined that a white light LED lamp that has tunable CRI and luminosity properties for any given color point target would be useful. Therefore, in one embodiment of the invention, a luminescent material phosphor coated LED chip having at least two distinct phosphor compositions with the same or similar color coordinates (e.g. on the CIE 1931 chromaticity diagram) is disclosed for providing white light. The phosphor or blend of phosphors in the compositions convert radiation at a specified wavelength, for example radiation having a peak from about 250 to 500 nm as emitted by a near UV or visible LED, into a different wavelength visible light.

As described below with reference to the Figures, the phosphor compositions are preferably deposited as distinct layers over the LED chip. However, other arrangements for the phosphor compositions are also contemplated, such as an intimate dispersion of the two layers in an encapsulant. The visible light provided by the phosphor compositions (and LED chip if emitting visible light) comprises a bright white light with high intensity and brightness. In one embodiment, the manufacturing of white LEDs using this method would involve creating a minimum of two layers containing phosphor compositions A and B, correspondingly. This could be done, e.g., either on a flat substrate (e.g. panels), a curved substrate (e.g. caps) or directly on the LED chip.

Figure 2:
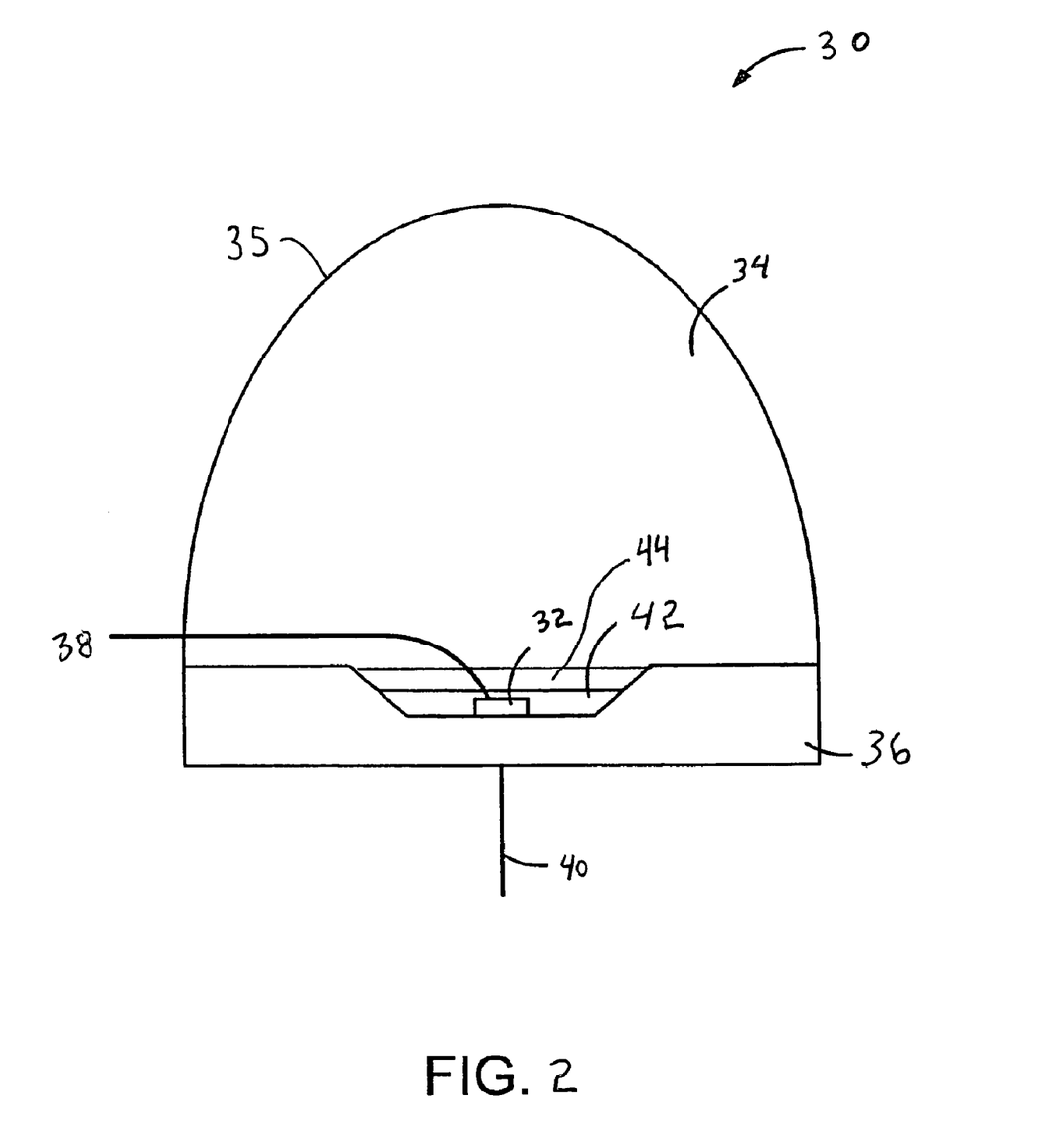
FIG. 2 is a schematic sectional view of an LED device in accord with a first embodiment.

Referring now to FIG. 2, a light-emitting device 30 according to one embodiment of the present invention is shown, including a radiation-emitting semiconductor body (such as an LED chip) 32.

The LED chip 32 may be encapsulated within a shell 35, which encloses the LED chip and an encapsulant material 34. The shell 35 may be, for example, glass or plastic. Preferably, the LED chip 32 is substantially centered in the encapsulant 34. The encapsulant 34 is preferably an epoxy, plastic, low temperature glass, polymer, thermoplastic, thermoset material, resin or other type of LED encapsulating material as is known in the art. Optionally, the encapsulant 34 is a spin-on glass or some other high index of refraction material. Preferably, the encapsulant material is an epoxy or a polymer material, such as silicone. Both the shell 35 and the encapsulant 34 are preferably transparent or substantially optically transmissive with respect to the wavelength of light produced by the LED chip 32 and any phosphor material present (described below). In an alternate embodiment, the lamp 30 may only comprise an encapsulant material without an outer shell. The LED chip 32 may be supported, for example, by the lead frame, by the self supporting electrodes, the bottom of the shell, or by a pedestal (not shown) mounted to the shell or to the lead frame.

As with a conventional LED light emitting device, the semiconductor body 32 may be located within reflector cup lead frame 36 and powered via conductive leads 38 and 40. The cup may be made from or coated with a reflective material, such as alumina, titania, or other dielectric powder known in the art. A preferred reflective material is $Al_2O_3$. A first phosphor composition layer 42 comprised of one or more phosphor compounds and embedded in a matrix of, for example, silicone or other suitable material, is radiationally coupled to the LED chip. Radiationally coupled means that the elements are associated with each other so radiation from one is transmitted to the other. The first layer 42 is positioned between the LED chip and a second phosphor composition layer 44, also containing one or more phosphor compounds. In the present description, although reference may be made to a single phosphor compound in each layer, it should be appreciated that both the first and second phosphor compositions may contain two or more different phosphor compounds.

Further, although reference is made to two separate phosphor composition layers distinct from the encapsulant 34, the exact position of the phosphor compositions may be modified, such as embedded in the encapsulant or coated on the lens element. In such a case, the two phosphor compositions may be present in a single layer wherein the relative amounts of each may still be adjusted. Thus, although presented in such a way for purposes of explanation, the two phosphor compositions may not necessarily form distinct layers or regions. The phosphor compositions (in the form of a powder) may be interspersed within a single region or layer of the encapsulant material to form different interspersed or adjacent patterns or arrangements or may even be dispersed throughout the entire volume of the encapsulant material. In fact, the invention does not envision any limitation with respect to the particular location of phosphor compositions.

Figure 3:
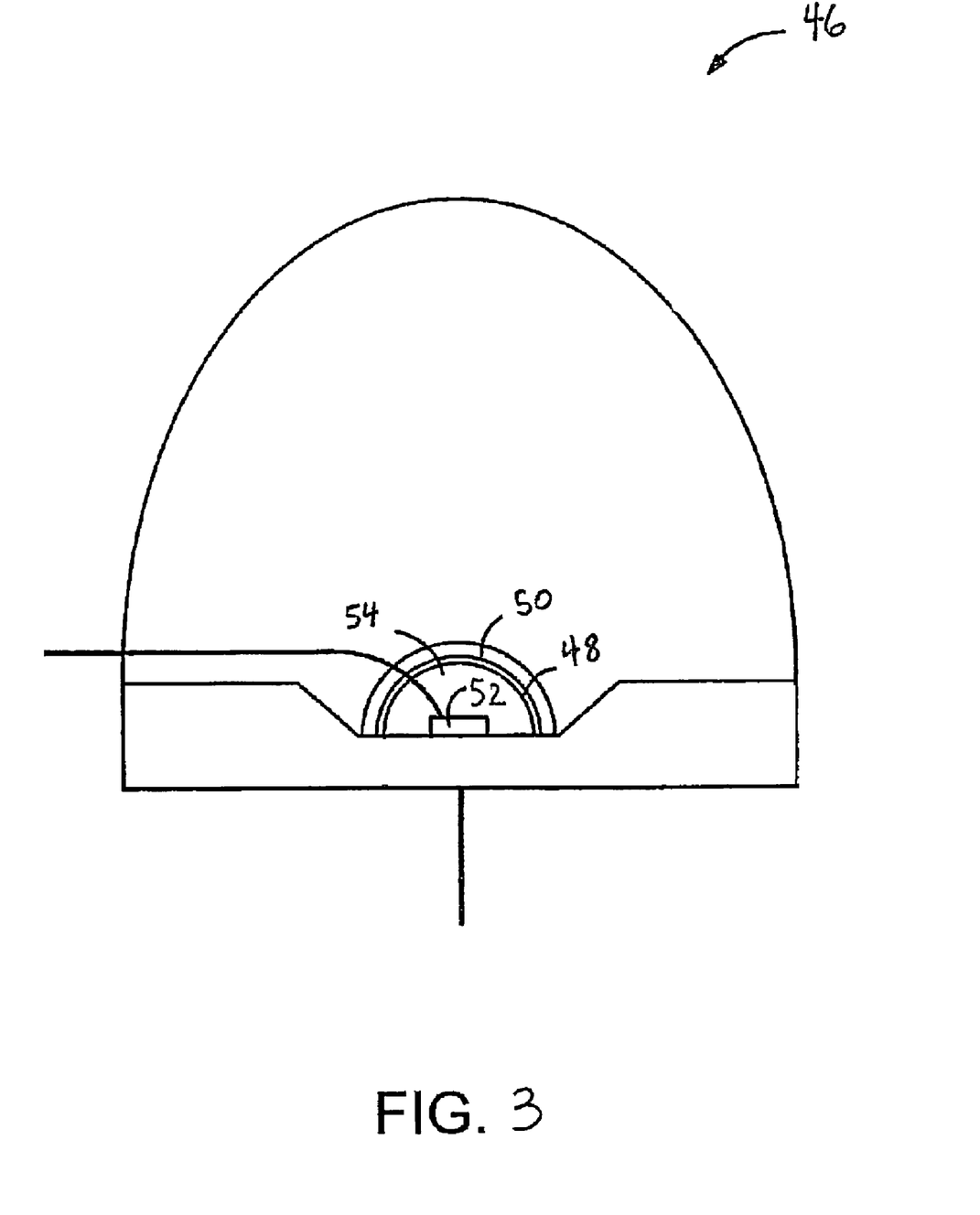
FIG. 3 is a schematic sectional view of an LED device in accord with a second embodiment.
Figure 4:
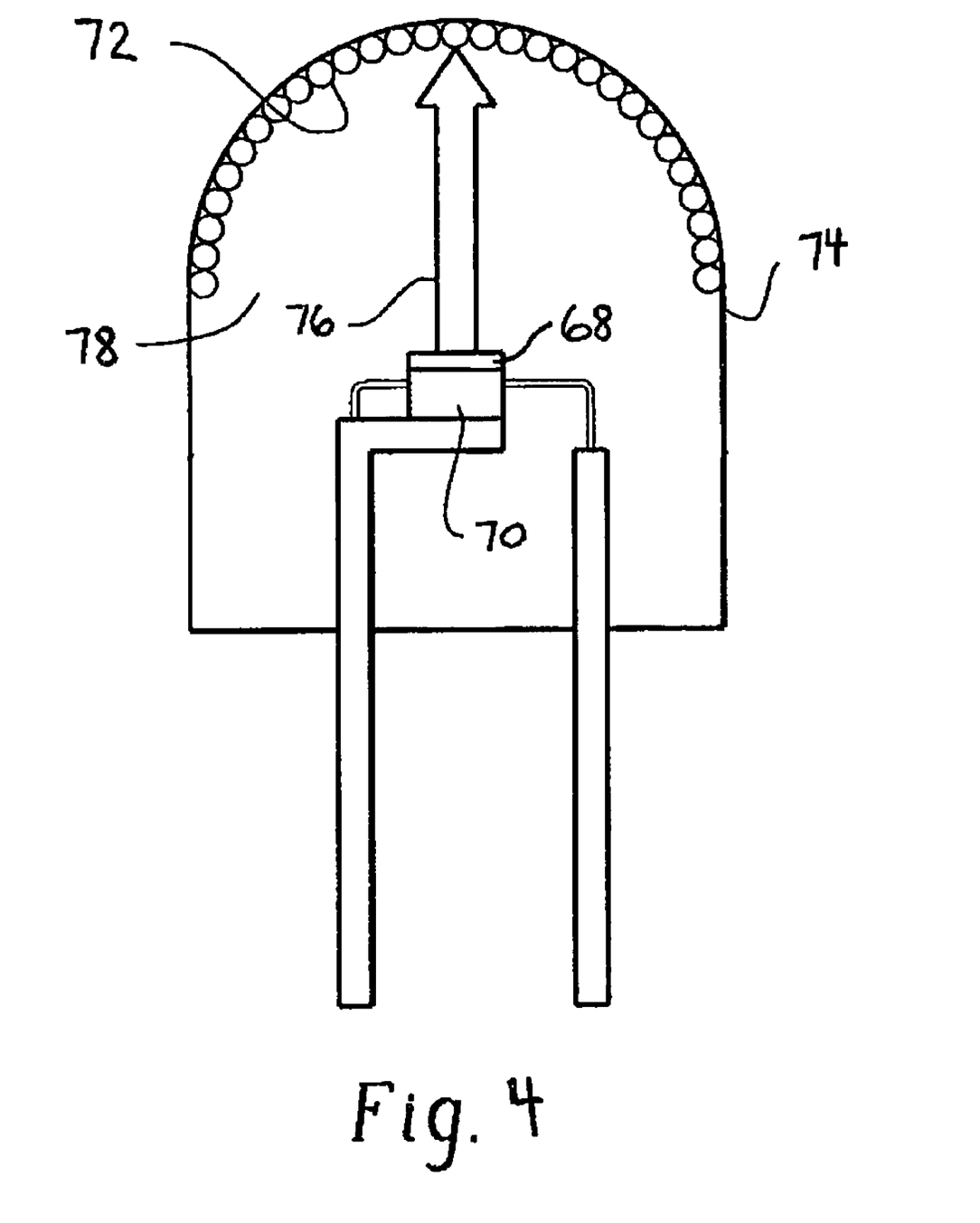
FIG. 4 is a schematic sectional view of an LED device in accord with a third embodiment.
Figure 5A:
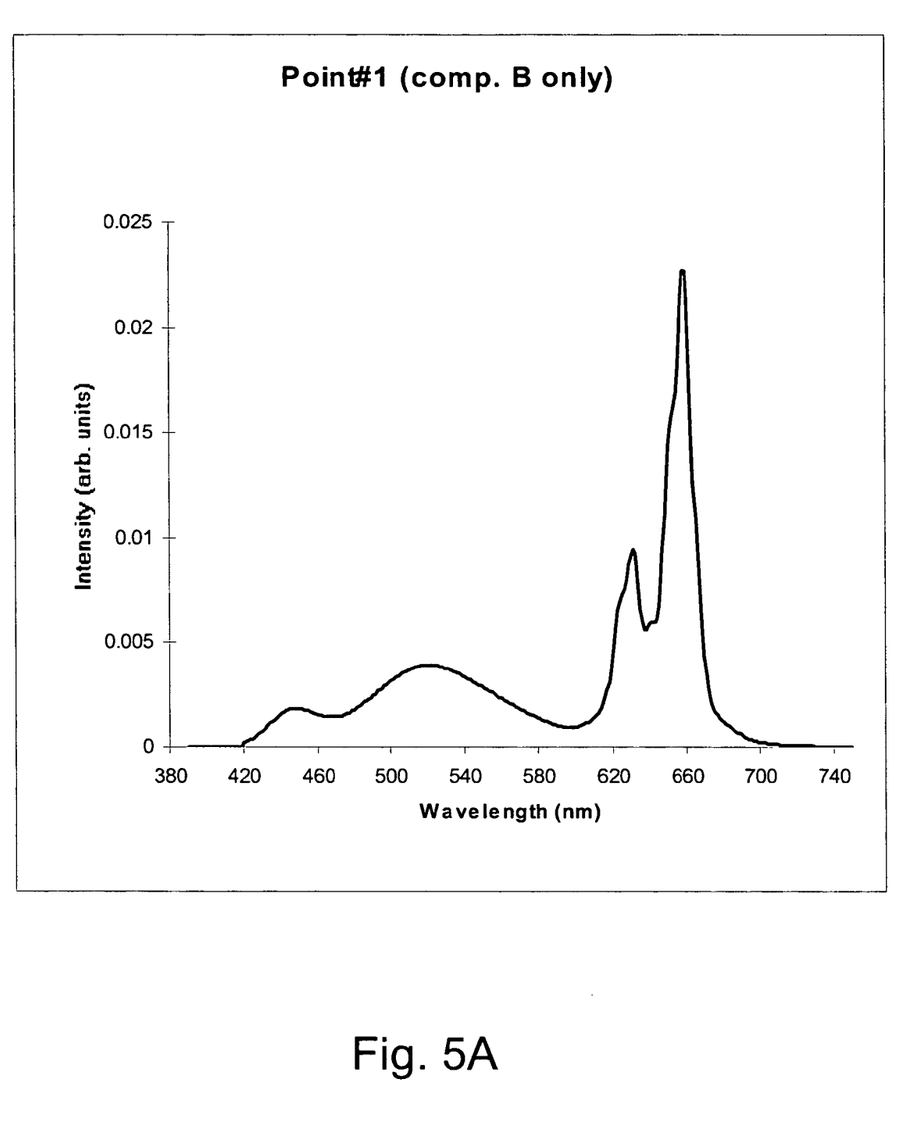
FIGS. 5a to 5e are the simulated emission spectra for a two phosphor composition lighting device as a function of the relative amounts of each composition in accordance with one embodiment.
Figure 5B:
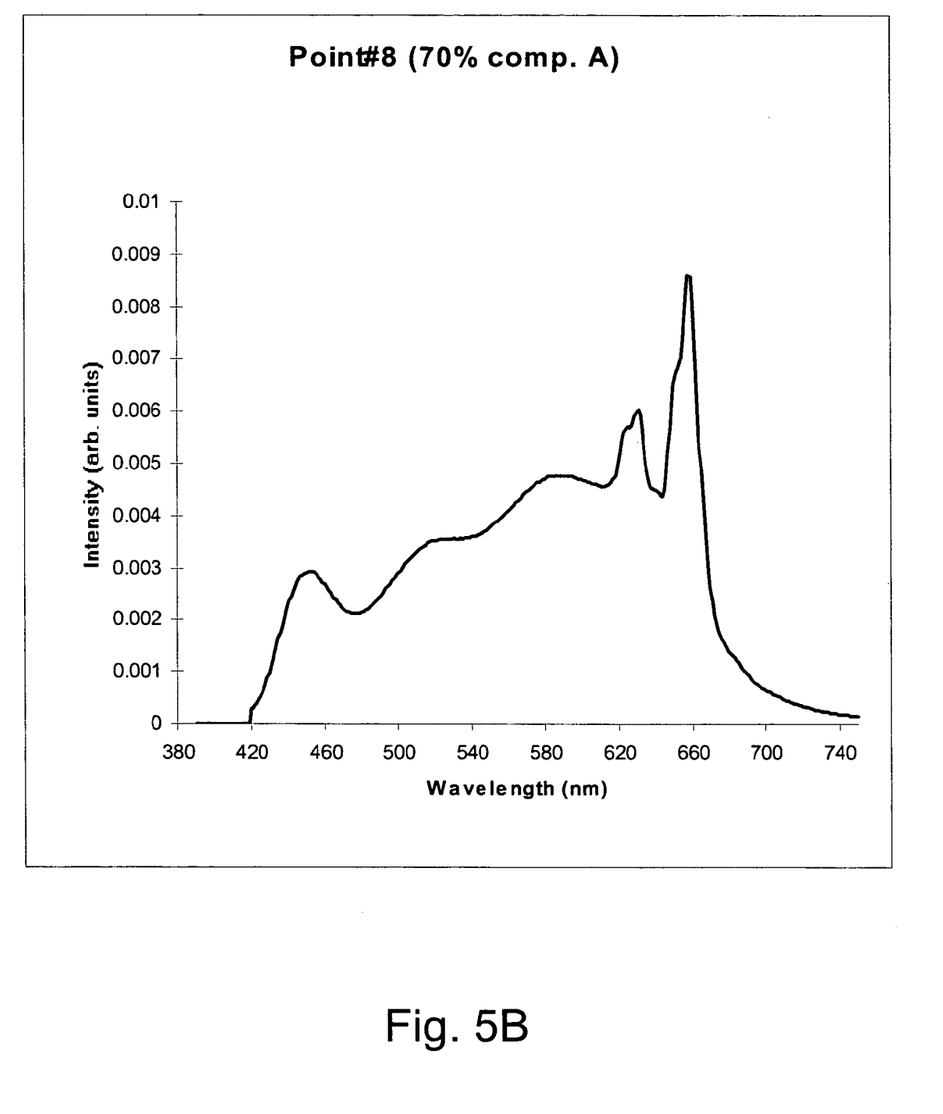
Figure 5C:
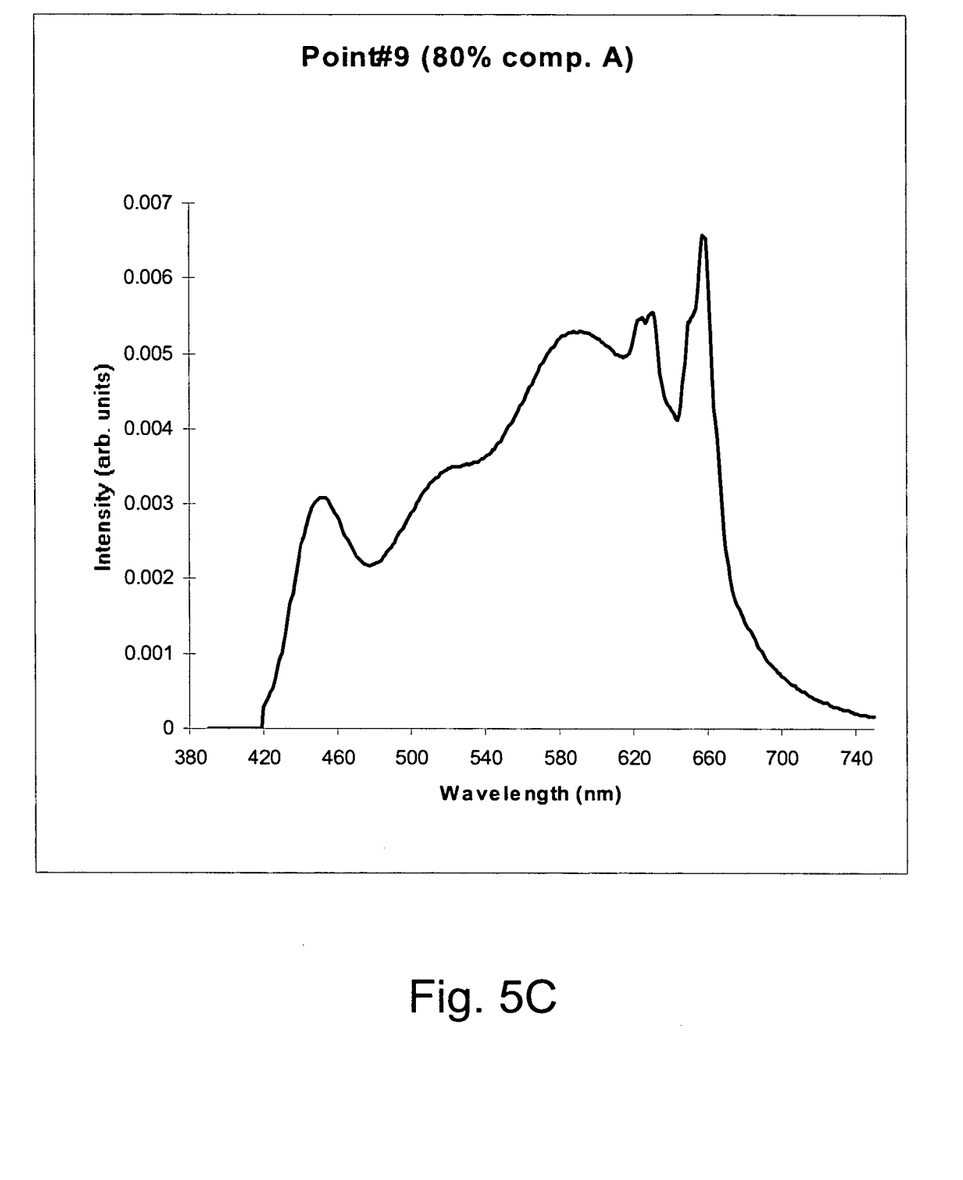
Figure 5D:
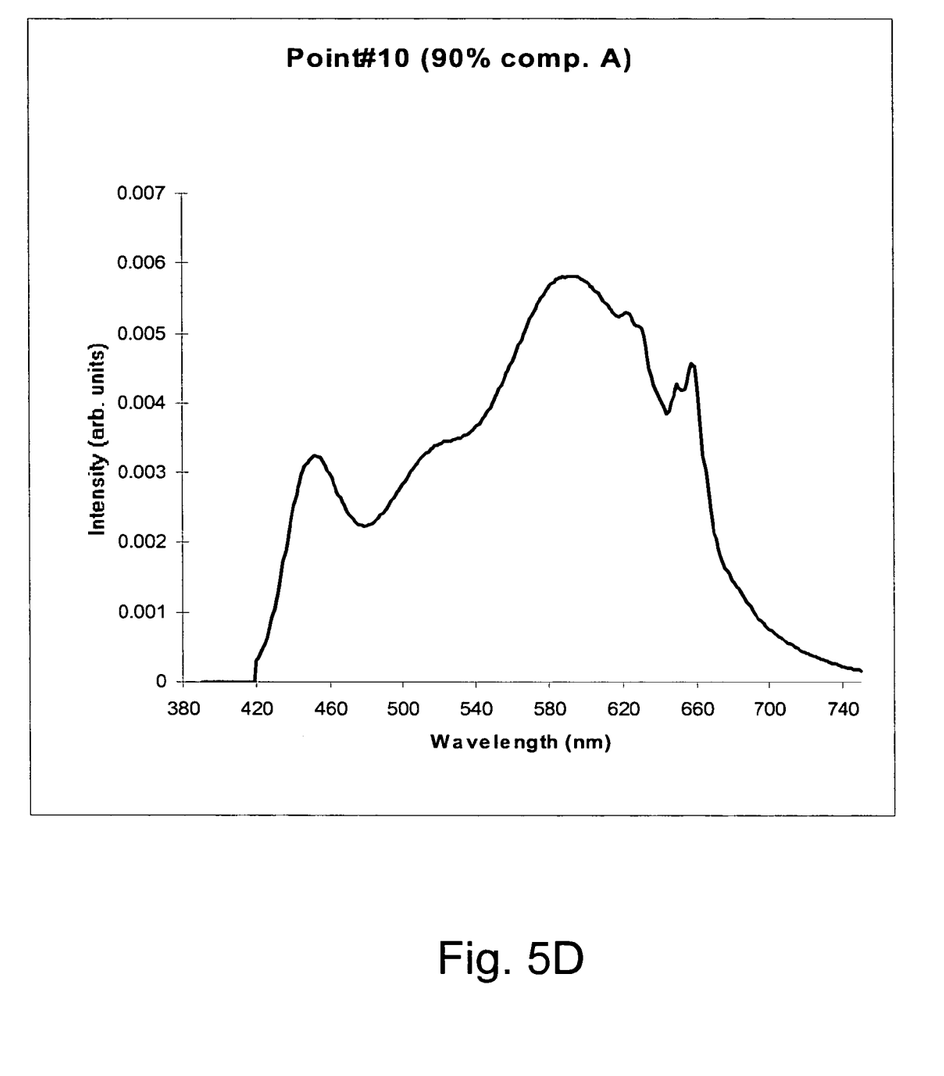
Figure 5E:
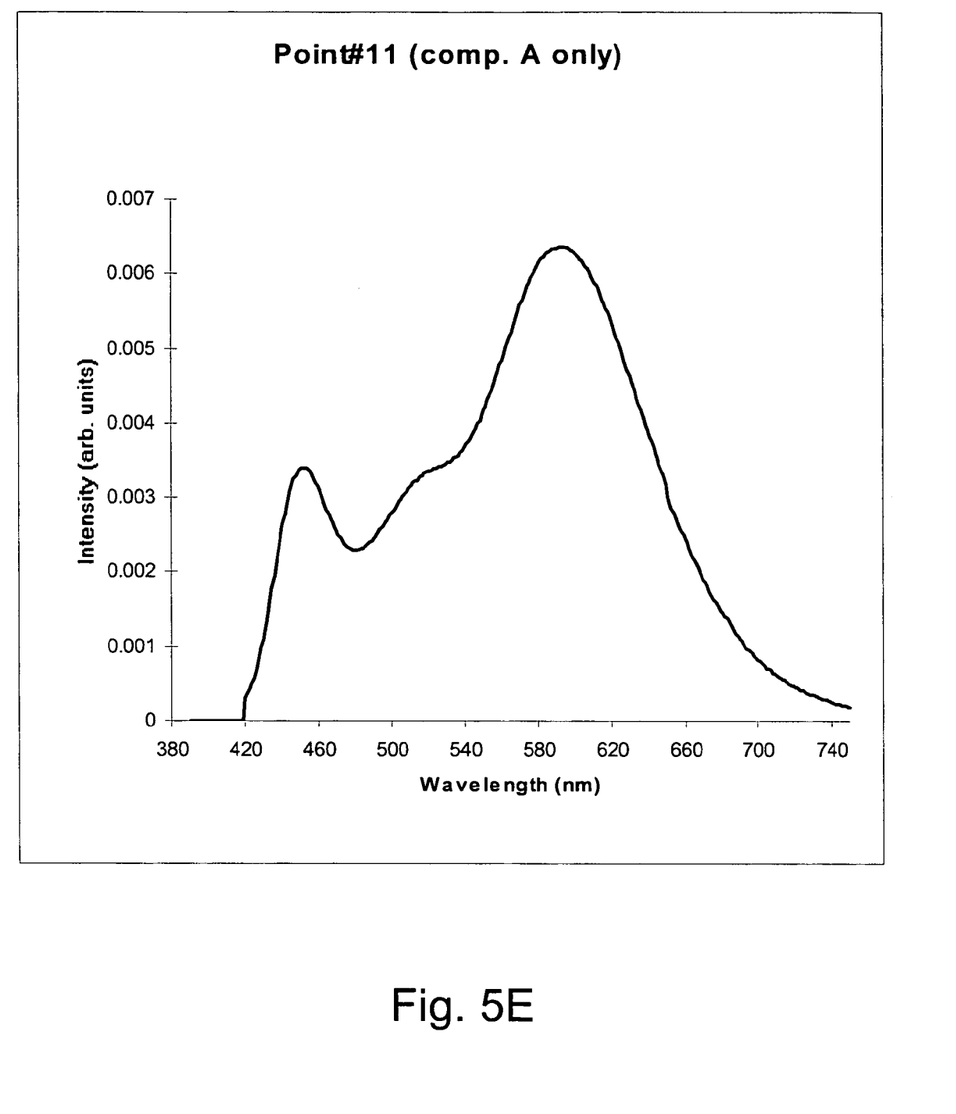

Typically, in a preferred embodiment, regardless of where or how the phosphors are positioned in the device, a majority of the first phosphor composition particles are preferably positioned closer to the LED chip, or otherwise designed to receive incident light from the LED chip prior to the second phosphor composition particles. Thus, for example, with reference to FIG. 3, a light emitting device 46 is shown in which first and second phosphor composition layers 48, 50 are positioned as hemispheres a specified distance away from the LED chip 52 leaving a gap 54. In a third embodiment, as shown in FIG. 4, a light emitting device is shown in which a first phosphor composition layer 68 is positioned on an LED chip 70, while a second phosphor composition layer 72 is positioned on an outer surface 74 of the LED device. Radiation 76 emitted from the LED chip is absorbed and reemitted by both phosphor composition layers while passing through an encapsulant 78. These are merely representative embodiments and should not be considered limiting. In addition, of course, the structures of FIGS. 2-4 may be combined and the phosphor may be located in any two or all three locations or in any other suitable location, such as separately from the shell or integrated into the LED.

The lamp may include any semiconductor visible or UV light source that is capable of producing white light when its emitted radiation is directed onto the phosphor. The preferred peak emission of the LED chip in the present invention will depend on the identity of the phosphor compositions in the disclosed embodiments and may range from, e.g., 250-500 nm. In one preferred embodiment, however, the emission of the LED will be in the near UV to deep blue region and have a peak wavelength in the range from about 360 to about 430 nm. Typically then, the semiconductor light source comprises an LED doped with various impurities. Thus, the LED may comprise a semiconductor diode based on any suitable III-V, II-VI or IV-IV semiconductor layers and having a peak emission wavelength of about 250 to 500 nm.

Preferably, the LED chip may contain at least one semiconductor layer comprising GaN, ZnSe or SiC. For example, the LED chip may comprise a nitride compound semiconductor represented by the formula $In_iGa_jAl_kN$ (where $0 \leq i$; $0 \leq j$; $0 \leq k$ and $i+j+k=1$) having a peak emission wavelength greater than about 250 nm and less than about 500 nm. Such LED semiconductors are known in the art. The radiation source is described herein as an LED for convenience. However, as used herein, the term is meant to encompass all semiconductor radiation sources including, e.g., semiconductor laser diodes.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

The phosphor composition layers in the above embodiments are deposited on the by any appropriate method. For example, a water based suspension of the phosphor(s) can be formed, and applied as a phosphor layer to the LED surface. In one such method, a silicone slurry in which the phosphor particles are randomly suspended is placed around the LED. If the phosphor is to be interspersed within the encapsulant material, then a phosphor powder may be added to a polymer precursor, loaded around the LED chip, and then the polymer precursor may be cured to solidify the polymer material. These methods are merely exemplary of possible positions of the phosphor layers and LED chip. Thus, the phosphor layers may be coated over or directly on the light emitting surface of the LED chip by coating and drying the phosphor suspension over the LED chip. When present, both the shell and the encapsulant should preferably be substantially transparent to allow radiation from the phosphor layers and, in certain embodiments, the LED chip, to be transmitted therethrough. Although not intended to be limiting, in one embodiment, the median particle size of the phosphor particles in the phosphor layers may be from about 1 to about 10 microns.

In any of the above structures, the lamp 10 may also include a plurality of scattering particles (not shown), which are embedded in the encapsulant material. The scattering particles may comprise, for example, $Al_2O_3$ particles such as alumina powder or $TiO_2$ particles. The scattering particles effectively scatter the coherent light emitted from the LED chip, preferably with a negligible amount of absorption.

While the present embodiment shows two phosphor composition layers, the invention is not limited to such and embodiments are contemplated containing three or more phosphor composition layers. Advantageously, a semiconductor composition in accord with this invention can be manufactured using conventional production lines.

In one embodiment, the phosphor composition layers possess essentially the same emission color coordinates (for example x and y coordinates on the 1931 CIE chromaticity diagram), each composition comprising at least 1 individual phosphor compound. Thus, at any given color point target, at least two basic phosphor compositions are prepared, each capable of providing essentially the same color point target with the LED chip to be used (preferably but not necessarily in the violet range, e.g. 405 nm). The number of phosphor compounds per composition can be anywhere from 1 (such as the phosphor compounds disclosed in U.S. Pat. No. 6,522, 065) to 2, 3 or more (such as the phosphor blends disclosed in U.S. Pat. No. 6,685,852), the disclosures of which are incorporated herein in their entirety. To minimize color point variation, the at least two compositions should preferably provide substantially the same color point when excited by the same source radiation, preferably to within 0.020 units in both x and y color coordinates on the 1931 CIE chromaticity diagram, more preferably to within 0.010 units, and most preferably to within 0.005 units.

By varying the amount of the two compositions relative to each other, this allows one to optimize the resulting lighting devices for CRI at a given minimal luminosity requirement, or vice versa, all while maintaining the same color point. That is, the two phosphor compositions, although having the same color coordinates, will have different CRI and luminosity characteristics when used with the selected LED chip. Thus, by varying the amounts of each composition in the LED device, one can alter the final CRI and luminosity characteristics of the device in a continuous fashion.

In this way, the method disclosed herein allows one to tune the CRI (e.g. maximize it for a given minimal luminosity requirement) or the luminosity (e.g. maximize it for a given minimal CRI requirement) of a lighting device without affecting the chemical makeup of the phosphor compounds used therein or compromising the color point target. This affords a set of at least two basic phosphor compositions to be used for the manufacturing of white LEDs with the same or similar color point but with CRI or luminosity values customized for specific applications.

As described above, each phosphor composition can include one or more individual phosphor compounds. Preferably, the identity of the individual phosphor(s) in each composition are selected such that the radiation emitted from each composition, when combined with any residual emission from the LED chip, produces a white light. Thus, when a UV LED chip is used, the phosphor compositions preferably include a blend of at least two phosphor compounds selected from the group including a red emitting phosphor, an orange emitting phosphor, a green emitting phosphor and a blue emitting phosphor. More preferably, the phosphor compositions include at least three phosphors from the above. Of course, the phosphor compositions may each include any number of phosphors, including a single phosphor.

The specific amounts of the individual phosphor compounds used in the phosphor compositions will depend upon the desired color temperature. The relative amounts of each phosphor in the phosphor compositions can be described in terms of spectral weight. The spectral weight is the relative amount that each phosphor contributes to the overall emission spectrum of the phosphor composition. Additionally, part of the LED light may be allowed to bleed through and contribute to the light spectrum of the device if necessary. The amount of LED bleed can be adjusted by changing the optical density of the phosphor layer, as routinely done for industrial blue chip based white LEDs. Alternatively, it may be adjusted by using a suitable filter or a pigment, as described further below.

The spectral weight amounts of all the individual phosphors in each phosphor composition should add up to 1 (i.e. 100%) of the emission spectrum of the individual phosphor composition. Likewise, the spectral weight amounts of all of the phosphor compositions and any residual bleed from the LED source should add up to 100% of the emission spectrum of the light device.

Although not intended to be limiting, preferred red-emitting phosphors for use in the phosphor compositions include those phosphors having an emission band with a maximum between about 615 nm and 680 nm, more preferably between about 625 nm and 660 nm. Specifically, preferred red-emitting phosphors may include $3.5MgO*0.5MgF_2*GeO_2:Mn^{4+}$ ("MFG") and/or $(Mg,Ca,Sr,Ba,Zn)_4Si_2O_8:Eu^{2+}, Mn^{2+}$ ("SASI Red").

Preferred orange-emitting phosphors include those having an emission band with a maximum between about 575 nm and 615 nm, more preferably between about 580 nm and 610 nm. Specifically, preferred orange-emitting phosphor formulations may include $(Mg,Ca,Sr,Ba,Zn)_5(PO_4)_3(F,Cl,Br,OH):Eu^{2+},Mn^{2+}$ ("HALO") and/or $(Mg,Ca,Sr,Ba,Zn)_2P_2O_7:Eu^{2+}, Mn^{2+}$ ("SPP").

Preferred green-emitting phosphors include those having an emission band with a maximum between about 500 nm and 575 nm, more preferably between about 510 nm and 560 nm, more preferably between about 515 nm and 545 nm. Specifically, preferred green-emitting phosphors may include $(Ca,Sr,Ba)Al_2O_4:Eu^{2+}$; $(Ca,Sr,Ba,Zn)_2SiO_4:Eu^{2+}$, and/or mixtures thereof.

Preferred blue-emitting phosphors include those having an emission band with a maximum between about 400 nm and 500 nm, more preferably between about 440 nm and 460 nm. Specifically, preferred blue-emitting phosphors may include $(Ca,Sr,Ba)_5(PO_4)_3(F,Cl,Br,OH):Eu^{2+}$ ("SECA"), and $(Ca,Sr,Ba)Mg_xAl_yO_{(1+x+1.5y)}:Eu^{2+}$ ("BAM") wherein x is an integer between about 1 and 5 and y is an integer between about 5 and 25, and mixtures thereof.

Other phosphors in addition to or in place of the above phosphors may be used. One such suitable phosphor is $A_{2-2x}Na_{1+x}E_xD_2V_3O_{12}$, wherein A may be Ca, Ba, Sr, or combinations of these; E may be Eu, Dy, Sm, Tm, or Er, or combinations thereof; D may be Mg or Zn, or combinations thereof and x ranges from 0.01 to 0.3. In addition, other suitable phosphors for use in the phosphor compositions include:

$(Ba,Sr,Ca)_5(PO_4)_3(Cl,F,Br,OH):Eu^{2+}, Mn^{2+}, Sb^{3+}$ $(Ba,Sr,Ca)BPO_5:Eu^{2+}, Mn^{2+}$ $(Sr,Ca)_{10}(PO_4)_6*nB_2O_3:Eu^{2+}$ $2SrO*0.84P_2O_5*0.16B_2O_3:Eu^{2+}$ $(Mg,Ca,Sr,Ba,Zn)_3B_2O_6:Eu^{2+}$ $Sr_2Si_3O_8*2SrCl_2:Eu^{2+}$ $Ba_3MgSi_2O_8:Eu^{2+}$ $Sr_4Al_{14}O_{25}:Eu^{2+}$ $BaAl_8O_{13}:Eu^{2+}$ $(Ba,Sr,Ca)MgAl_{10}O_{17}:Eu^{2+}, Mn^{2+}$ $(Ba,Sr,Ca)Al_2O_4:Eu^{2+}$ $(Y,Gd,Lu,Sc,La)BO_3:Ce^{3+} Tb^{3+}$ $Ca_8Mg(SiO_4)_4Cl_2:Eu^{2+},Mn^{2+}$ $(Ba,Sr,Ca)_2SiO_4:Eu^{2+}$ $(Ba,Sr,Ca)_2(Mg,Zn)Si_2O_7:Eu^{2+}$ $(Sr,Ca,Ba)(Al,Ga,In)_2S_4:Eu^{2+}$ $(Y,Gd,Tb,La,Sm,Pr,Lu)_3(Al,Ga)_5O_{12}:Ce^{3+}$ $(Ca,Sr)_8(Mg,Zn)(SiO_4)_4Cl_2:Eu^{2+}, Mn^{2+}$ $Na_2Gd_2B_2O_7:Ce^{3+}, Tb^{3+}$ $(Ba,Sr)_2(Ca,Mg,Zn)B_2O_6:K,Ce,Tb$ $(Gd,Y,Lu,La)_2O_3:Eu^{3+}Bi^{3+}$ $(Gd,Y,Lu,La)_2O_2S:Eu^{3+},Bi^{3+}$ $(Gd,Y,Lu,La)VO_4:Eu^{3+}, Bi^{3+}$ $(Ca,Sr)S:Eu^{2+}$ $SrY_2S_4:Eu^{2+}$ $CaLa_2S_4:Ce^{3+}$ $(Y,Lu)_2WO_6:Eu^{3+}, Mo^{6+}$ $(Mg,Ca,Sr,Ba,Zn)_v(Si,Ge)_yN_{(2v/3+4y/3)}:Eu^{2+}$ $(Mg,Ca,Sr,Ba,Zn)_v(Si,Ge)_yO_zN_{(2v/3+4y/3+2z/3)}:Eu^{2+}$

It will be appreciated by a person skilled in the art that other phosphor compounds with sufficiently similar emission spectra may be used instead of any of the preceding suitable examples of red, orange, green, blue, or other phosphors, even though the chemical formulations of such substitutes may be significantly different from the aforementioned examples.

The ratio of each of the individual phosphor compounds in each of the phosphor compositions may vary depending on the characteristics of the desired light output. The relative proportions of the individual phosphors in the various embodiment phosphor compositions may be adjusted such that when their emissions are blended and employed in an LED lighting device, there is produced visible light of predetermined x and y values on the CIE chromaticity diagram. As stated, a white light is preferably produced. This white light may, for instance, may possess an x value in the range of about 0.30 to about 0.55, and a y value in the range of about 0.30 to about 0.55. As stated, however, the exact identity and amounts of each phosphor compound in the phosphor composition can be varied according to the needs of the end user.

The above described phosphor compounds may be produced using known solid state reaction processes for the production of phosphors by combining, for example, elemental oxides, carbonates and/or hydroxides as starting materials. Other starting materials may include nitrates, sulfates, acetates, citrates, or oxalates. In a typical process, the starting materials are combined via a dry or wet blending process and fired in air or under a reducing atmosphere at from, e.g., 900 to 1600° C.

A fluxing agent may be added to the mixture before or during the step of mixing. This fluxing agent may be $NH_4Cl$ or any other conventional fluxing agent, such as a fluoride of at least one metal selected from the group consisting of terbium, aluminum, gallium, and indium. A quantity of a fluxing agent of less than about 20, preferably less than about 10, percent by weight of the total weight of the mixture is adequate for fluxing purposes.

The starting materials may be mixed together by any mechanical method including, but not limited to, stirring or blending in a high-speed blender or a ribbon blender. The starting materials may be combined and pulverized together in a ball mill, a hammer mill, or a jet mill. The mixing may be carried out by wet milling especially when the mixture of the starting materials is to be made into a solution for subsequent precipitation. If the mixture is wet, it may be dried first before being fired under a reducing atmosphere at a temperature from about 900° C. to about 1700° C., preferably from about 900° C. to about 1500° C., for a time sufficient to convert all of the mixture to the final material.

The firing may be conducted in a batchwise or continuous process, preferably with a stirring or mixing action to promote good gas-solid contact. The firing time depends on the quantity of the mixture to be fired, the rate of gas conducted through the firing equipment, and the quality of the gas-solid contact in the firing equipment. Typically, a firing time up to about 10 hours is adequate. The reducing atmosphere typically comprises a reducing gas such as hydrogen, carbon monoxide, or a combination thereof, optionally diluted with an inert gas, such as nitrogen, argon, or a combination thereof. Alternatively, the crucible containing the mixture may be packed in a second closed crucible containing high-purity carbon particles and fired in air so that the carbon particles react with the oxygen present in air, thereby, generating carbon monoxide for providing a reducing atmosphere.

In one embodiment, these compounds may be blended and dissolved in a nitric acid solution. The strength of the acid solution is chosen to rapidly dissolve the oxygen-containing compounds and the choice is within the skill of a person skilled in the art. Ammonium hydroxide is then added in increments to the acidic solution. An organic base such as methanolamine, ethanolamine, propanolamine, dimethanolamine, diethanolamine, dipropanolamine, trimethanolamine, triethanolamine, or tripropanolamine may be used in place of ammonium hydroxide.

The precipitate may be filtered, washed with deionized water, and dried. The dried precipitate may be ball milled or otherwise thoroughly blended and then calcined in air at about 400° C. to about 1600° C. for a sufficient time to ensure a substantially complete dehydration of the starting material. The calcination may be carried out at a constant temperature. Alternatively, the calcination temperature may be ramped from ambient to and held at the final temperature for the duration of the calcination. The calcined material is similarly fired at 1000-1600° C. for a sufficient time under a reducing atmosphere such as $H_2$, CO, or a mixture of one of theses gases with an inert gas, or an atmosphere generated by a reaction between a coconut charcoal and the products of the decomposition of the starting materials to covert all of the calcined material to the desired phosphor compound.

It may be desirable to add pigments or filters to the phosphor compositions. Thus, the phosphor compositions and/or encapsulant may also comprise from 0 up to about 20% by weight (based on the total weight of the phosphors) of a pigment or other UV absorbent material capable of absorbing UV radiation having a wavelength between 250 nm and 500 nm.

Suitable pigments or filters include any of those known in the art that are capable of absorbing radiation generated between 250 nm and 500 nm. Such pigments include, for example, nickel titanate or praseodimium zirconate. The pigment is used in an amount effective to filter 10% to 100% of the radiation generated in the 250 nm to 450 nm range.

By assigning appropriate spectral weights for each phosphor compound, one can create spectral blends for use in each phosphor composition to cover the relevant portions of color space, especially for white lamps. Specific examples of this are shown below. For various desired color points, one can determine the identity and appropriate amounts of each phosphor compound to include in the individual compositions. Thus, one can customize phosphor blends for use in the compositions to produce almost any CCT or color point, with control over the CRI and luminosity based on the amount of each composition in the lighting device.

The examples shown are for representative spectra of each phosphor. Of course, the color of each phosphor will be dependent upon its exact makeup (e.g. relative amounts of Ba, Ca, Sr, as well as Eu in BAM phosphor), which can change the color of the phosphor to a degree where it may have to be renamed, e.g. green instead of blue. In addition, some phosphors such as SASI Red and HALO may emit a secondary blue peak from the co-activator ($Eu^{2+}$ in this case), which will contribute to the emission from the blue phosphor in the blend (SECA or BAM). However, determining the changes in the spectral weight to produce the same or similar characteristic lighting device necessitated by such variations is trivial and can be accomplished by one skilled in the art using various methodologies, such as design of experiment (DOE) or other strategies.

By use of the present embodiments wherein two or more phosphor compositions with the same color points are used in a lighting device, lamps can be provided having customizable CRI and luminosity for a given color point. The preparation of each phosphor composition, including the identity and amounts of each phosphor compound present therein, and the evaluation of its contribution to the LED spectrum would be trivial for a person skilled in the art and can be done using established techniquest aided by, e.g., the DOE approach such as the preparation of a series of devices with various thicknesses of two phosphor compositions.

EXAMPLES

Light sources using phosphor blends according to the above embodiments may be produced. Two different exemplary prophetic trials are presented. In a first trial, two different phosphor composition layers A and B are investigated. This trial was for two triphosphor compositions targeting the 3500K point on the black body locus of the CIE chromaticity diagram. This color point is chosen merely for illustration and by no means restricts the scope of applicability of this invention. The spectral weight amounts of each phosphor in composition layers A and B are listed in Table 1. The phosphors selected for this trial were $3.5MgO*0.5MgF_2*GeO_2:Mn^{4+}$ ("MFG") as red, $Ca_5(PO_4)_3Cl:Eu^{2+},Mn^{2+}$ ("HALO") for orange, $SrAl_2O_4:Eu^{2+}$ for green and $(Ca,Sr,Ba)_5(PO_4)_3Cl:Eu^{2+}$ ("SECA") for blue.

TABLE 1

| Composition | SECA | $SrAl_2O_4$ | HALO | MFG | Total |
|---|---|---|---|---|---|
| A | 0.1022 | 0.2675 | 0.6303 | 0.0000 | 1.0000 |
| B | 0.0771 | 0.3382 | 0.0000 | 0.5847 | 1.0000 |

Table 2 shows a set of simulated spectral models at different levels of spectral contribution from compositions A and B (0 to 100% each in 10% increments) under 405 nm excitation, with a cutoff filter applied to all wavelengths lower than 420 nm. Of course, other combinations are also possible, e.g. 75% of composition A and 25% of composition B. The use of filtering is optional and preferable in cases where shorter wavelength radiation is to be eliminated; it does not otherwise restrict the generality of the approach. The simulated emission spectra for Points 1, 8, 9, 10 and 11 are also shown in FIGS. 5a-5e. Each of the eleven points has the same color coordinates on the CIE 1931 chromaticity diagram (x=0.405, y=0.391).

TABLE 2

| Point # | Comp. A | Comp. B | $R_a$ | $R_9$ | Mean CRI | $Im/W_{rad}$ |
|---|---|---|---|---|---|---|
| 1 | 0% | 100% | 42 | −169 | 29 | 214 |
| 2 | 10% | 90% | 53 | −123 | 42 | 226 |
| 3 | 20% | 80% | 63 | −80 | 54 | 238 |
| 4 | 30% | 70% | 72 | −39 | 65 | 250 |
| 5 | 40% | 60% | 80 | 1 | 76 | 262 |
| 6 | 50% | 50% | 88 | 38 | 85 | 274 |
| 7 | 60% | 40% | 95 | 74 | 93 | 285 |
| 8 | 70% | 30% | 98 | 92 | 97 | 297 |
| 9 | 80% | 20% | 92 | 59 | 89 | 309 |
| 10 | 90% | 10% | 86 | 27 | 82 | 321 |
| 11 | 100% | 0% | 81 | −4 | 75 | 333 |

Figure 6:
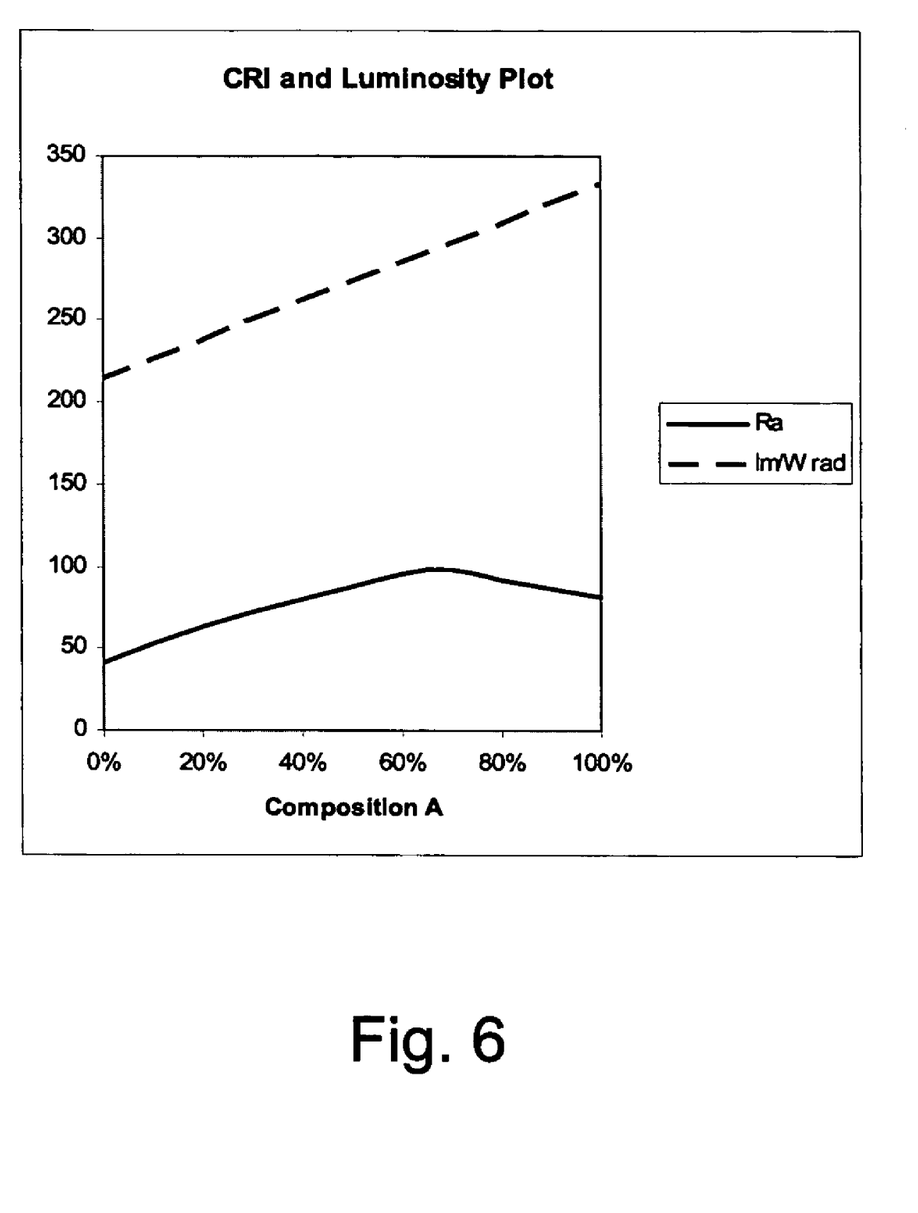
FIG. 6 is a graph of the calculated $R_a$ and luminosity of a lighting device as a function of an amount of a first phosphor composition therein according to a first embodiment.

It can be seen from Table 2 that, while the luminosity (shown in $Im/W_{rad}$) increases continuously in proportion to the contribution of composition A, the general CRI value ($R_a$) has a maximum around Point 8, which is a good choice to maximize the $R_a$ regardless of luminosity. However, if a higher luminosity is (e.g. greater than 300 lumens per watt of radiation input or $Im/W_{rad}$), then a tradeoff needs to be sought between this requirement and the declining $R_a$ from point 9 through 11. If a minimal $R_a$ of 90 was required, for example, point 9 would be adequate, and if a minimal $R_a$ of 85 was needed, point 10 would satisfy this requirement at the maximum luminosity. Similar observations can be made with respect to the mean CRI (e.g. of $R_1$ through $R_{14}$) or special CRI (e.g. $R_9$) values. FIG. 6 is a graph of the general CRI ($R_a$) and luminosity of the proposed device as a function of the amount of composition A. It can be seen from this example how the fine tuning of CRI and/or luminosity allows flexibility and can provide a full product basket.

In a second trial, two different phosphor composition layers A and B are investigated. This trial was for two diphosphor compositions targeting the 2000K point on the black body locus of the CIE chromaticity diagram. The spectral amounts of each phosphor in composition layers A and B are listed in Table 3. The phosphors selected for this trial were MFG, HALO, and $SrAl_2O_4:Eu^{2+}$.

TABLE 3

| Composition | $SrAl_2O_4$ | HALO | MFG | Total |
|---|---|---|---|---|
| A | 0.0187 | 0.9813 | 0.0000 | 1.0000 |
| B | 0.2290 | 0.0000 | 0.7710 | 1.0000 |

Table 4 shows a set of simulated spectral models at different levels of spectral contribution from compositions A and B (0 to 100% each in 10% increments) under 405 nm excitation, with a cutoff filter applied to all wavelengths lower than 420 nm.

TABLE 4

| Point# | Comp. A | Comp. B | Ra | Im/W rad | x | y |
|---|---|---|---|---|---|---|
| 1 | 0% | 100% | 21 | 177 | 0.529 | 0.411 |
| 2 | 10% | 90% | 42 | 192 | 0.526 | 0.409 |
| 3 | 20% | 80% | 60 | 207 | 0.524 | 0.407 |
| 4 | 30% | 70% | 75 | 222 | 0.522 | 0.405 |
| 5 | 40% | 60% | 89 | 237 | 0.520 | 0.403 |
| 6 | 50% | 50% | 97 | 252 | 0.519 | 0.402 |
| 7 | 60% | 40% | 87 | 267 | 0.518 | 0.401 |
| 8 | 70% | 30% | 78 | 282 | 0.517 | 0.400 |
| 9 | 80% | 20% | 69 | 297 | 0.516 | 0.399 |
| 10 | 90% | 10% | 60 | 312 | 0.515 | 0.398 |
| 11 | 100% | 0% | 53 | 327 | 0.514 | 0.397 |

Figure 7:
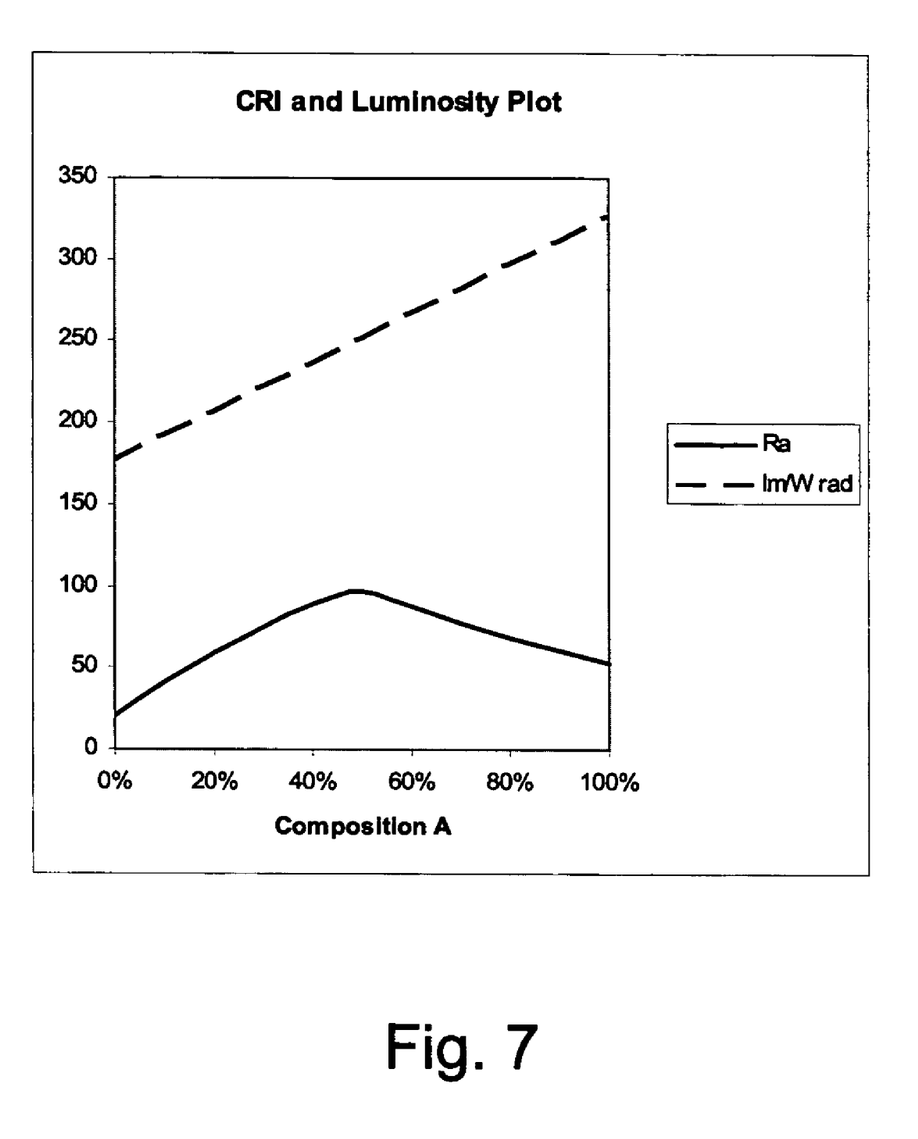
FIG. 7 is a graph of the calculated $R_a$ and luminosity of a lighting device as a function of an amount of a first phosphor composition therein according to a second embodiment.

As with the previous example, it can be seen from Table 4 that, while the luminosity (shown in $Im/W_{rad}$) increases continuously in proportion to the contribution of composition A, the $R_a$ value has a maximum around Point 6, all while the color point remains approximately constant, as evidenced by the closeness of the x and y values of the points. FIG. 7 is a graph of the CRI $R_a$ and luminosity of the device as a function of the amount of composition A. If a higher luminosity is needed or desired, then a tradeoff needs to be sought between this requirement and the declining CRI from point 7 through 11. If a minimal $R_a$ of 85 were needed, point 7 would satisfy this requirement at the maximum luminosity.

The invention has been described with reference to the preferred embodiment. Obviously, modifications and alterations will occur to others upon reading and understanding the preceding, detailed description. It is intended that the invention be construed as including all such modifications and alterations, insofar as they come within the scope of the appended claims or the equivalents thereof.

What is claimed is:

1. A lighting apparatus for emitting white light comprising:
 a semiconductor light source emitting radiation having a peak emission at from about 250 to 500 nm;
 a first phosphor composition comprising at least one phosphor compound radiationally coupled to said light source; and
 a second phosphor composition, distinct from said first phosphor composition, comprising at least one phosphor compound radiationally coupled to said light source; wherein said first and second phosphor compositions have substantially the same emission color coordinates when excited by the same source radiation; wherein the first phosphor composition has one of a different luminosity and a different CRI than the second phosphor composition.

2. The lighting apparatus of claim 1, further including a pigment, filter or other absorber capable of absorbing radiation generated between 250 nm and 450 nm.

3. The lighting apparatus of claim 1, wherein at least one of said first and second phosphor compositions comprises two or more phosphor compounds.

4. The lighting apparatus of claim 1, wherein at least one of said first and second phosphor compositions includes a phosphor compound having an emission band with a maximum between about 615 nm and 680 nm.

5. The lighting apparatus of claim 1, wherein at least one of said first and second phosphor compositions includes a phosphor compound having an emission band with a maximum between about 625 nm and 660 nm.

6. The lighting apparatus of claim 1, wherein at least one of said first and second phosphor compositions includes a phosphor compound having an emission band with a maximum between about 575 to 615 nm.

7. The lighting apparatus of claim 1, wherein at least one of said first and second phosphor compositions includes a phosphor compound having an emission band with a maximum between about 500 to 575 nm.

8. The lighting apparatus of claim 1, wherein at least one of said first and second phosphor compositions includes a phosphor compound having an emission band with a maximum between about 400 to 500 nm.

9. The lighting apparatus of claim 1, wherein said first and second phosphor compositions have color points within 0.020 units of each other in both x and y color coordinates on the CIE chromaticity diagram.

10. The lighting apparatus of claim 1, wherein said lighting apparatus has substantially the same color point on the CIE chromaticity diagram regardless of the relative amounts of said first and second phosphor compositions present in said apparatus.

11. The lighting apparatus of claim 1, wherein a color point of said lighting apparatus lies on or substantially on the black body locus of the CIE chromaticity diagram.

12. The lighting apparatus of claim 1, wherein said first and second phosphor compositions are in the form of discrete layers.

13. The lighting apparatus of claim 1, wherein said first and second phosphor compositions comprise one or more phosphor compounds selected from the group consisting of (Mg, Ca,Sr,Ba,Zn)$_4$Si$_2$O$_8$:Eu$^{2+}$,Mn$^{2+}$; 3.5MgO*0.5MgF$_2$*GeO$_2$:Mn$^{4+}$; (Ca,Sr,Ba)$_5$(PO$_4$)$_3$(F,Cl,Br,OH):Eu$^2$; (Ca,Sr,Ba)Mg$_x$Al$_y$O$_{(1+x+1.5y)}$:Eu$^{2+}$, wherein x is an integer between about 1 and 5 and y is an integer between about 5 and 25; (Mg, Ca,Sr,Ba,Zn)$_2$P$_2$O$_7$:Eu$^{2+}$,Mn$^{2+}$; (Mg, Ca,Sr,Ba,Zn)$_5$(PO$_4$)$_3$(F,Cl,Br,OH):Eu$^{2+}$, Mn$^{2+}$; (Ba,Sr,Ca)$_5$(PO$_4$)$_3$(Cl,F,Br,OH):Eu$^{2+}$,Mn$^{2+}$,Sb$^{3+}$; (Ba, Sr, Ca)BPO$_5$:Eu$^{2+}$,Mn$^{2+}$; (Sr, Ca)$_{10}$(PO$_4$)$_6$*nB$_2$O$_3$:Eu$^{2+}$; (Mg, Ca,Sr,Ba,Zn)$_3$B$_2$O$_6$:Eu$^{2+}$; 2SrO*0.84P$_2$O$_5$*0.16B$_2$O$_3$:Eu$^{2+}$; Sr$_2$Si$_3$O$_8$*2SrCl$_2$:Eu$^{2+}$; Ba$_3$MgSi$_2$O$_8$:Eu$^{2+}$; Sr$_4$Al$_{14}$O$_{25}$:Eu$^{2+}$; BaAl$_8$O$_{13}$:Eu$^{2+}$; (Ba, Sr, Ca)MgAl$_{10}$O$_{17}$:Eu$^{2+}$,Mn$^{2+}$; (Ba,Sr, Ca)Al$_2$O$_4$:Eu$^{2+}$; (Y,Gd,Lu,Sc,La)BO$_3$:Ce$^{3+}$,Tb$^{3+}$; Ca$_8$Mg(SiO$_4$)$_4$Cl$_2$:Eu$^{2+}$, Mn$^{2+}$; (Ba,Sr, Ca)$_2$SiO$_4$:Eu$^{2+}$; (Ba,Sr, Ca)$_2$(Mg,Zn)Si$_2$O$_7$:Eu$^{2+}$; (Sr,Ca,Ba)(Al,Ga,In)$_2$S$_4$:Eu$^{2+}$; (Y,Gd,Tb,La,Sm,Pr,Lu)$_3$(Al,Ga)$_5$O$_{12}$:Ce$^{3+}$; (Ca,Sr)$_8$(Mg,Zn)(SiO$_4$)$_4$Cl$_2$:Eu$^{2+}$, Mn$^{2+}$; Na$_2$Gd$_2$B$_2$O$_7$:Ce$^{3+}$,Tb$^{3+}$; (Ba,Sr)$_2$(Ca,Mg,Zn)B$_2$O$_6$:K,Ce,Tb; (Gd,Y,Lu,La)$_2$O$_3$:Eu$^{3+}$,Bi$^{3+}$; (Gd,Y,Lu,La)$_2$O$_2$S:Eu$^{3+}$,Bi$^{3+}$; (Gd,Y,Lu,La)VO$_4$:Eu$^{3+}$,Bi$^{3+}$; (Ca,Sr)S:Eu$^{2+}$, SrY$_2$S$_4$:Eu$^{2+}$; CaLa$_2$S$_4$:Ce$^{3+}$; (Y,Lu)$_2$WO$_6$:Eu$^{3+}$,Mo$^{6+}$; (Mg, Ca,Sr,Ba,Zn)$_x$(Si,Ge)$_y$N$_{(2v/3+4y/3)}$:Eu$^{2+}$; (Mg, Ca,Sr,Ba,Zn)$_v$(Si,Ge)$_y$O$_2$N$_{(2v/3+4y/3+2z/3)}$:Eu$^{2+}$; and A$_{2-2x}$Na$_{1+x}$E$_x$D$_2$V$_3$O$_{12}$, wherein A may be Ca, Ba, Sr, or combinations thereof, E may be Eu, Dy, Sm, Tm, or Er, or combinations thereof, D may be Mg or Zn, or combinations thereof and x ranges from 0.01 to 0.3.

14. A method for making a lighting apparatus for emitting white light which can achieve a tunable color rendering index (CRI) and luminosity, the method including the steps of
providing a semiconductor light source emitting radiation having a peak emission at from about 250 to 500 nm;
providing a first phosphor composition comprising at least one phosphor compound radiationally coupled to said light source; and
providing a second phosphor composition, distinct from said first phosphor composition, comprising at least one phosphor compound radiationally coupled to said light source; wherein the first and second phosphor compositions have substantially the same emission color coordinates when excited by the same source radiation; wherein the first phosphor composition has one of a different luminosity and a different CRI than the second phosphor composition.

15. The method of claim 14, further comprising providing a pigment, filter or other absorber capable of absorbing radiation generated between 250 nm and 450 nm to absorb radiation emitted from said light source.

16. The method of claim 14, wherein at least one of said first and second phosphor compositions includes a phosphor compound having an emission band with a maximum between about 615 nm and 680 nm.

17. The method of claim 14, wherein at least one of said first and second phosphor compositions includes a phosphor compound having an emission band with a maximum between about 575 to 615 nm.

18. The method of claim 14, wherein at least one of said first and second phosphor compositions includes a phosphor compound having an emission band with a maximum between about 500 to 575 nm.

19. The method of claim 14, wherein at least one of said first and second phosphor compositions includes a phosphor compound having an emission band with a maximum between about 400 to 500 nm.

20. The method of claim 14, wherein said first and second phosphor compositions have color points within 0.020 units of each other in both x and y color coordinates on the CIE chromaticity diagram.

21. The method of claim 14, wherein said lighting apparatus has substantially the same color point on the CIE chromaticity diagram regardless of the relative amounts of said first and second phosphor compositions present in said apparatus.

22. The method of claim 14, wherein said first and second phosphor compositions comprise one or more phosphor compounds selected from the group consisting of (Mg, Ca,Sr,Ba,Zn)$_4$Si$_2$O$_8$:Eu$^{2+}$,Mn$^{2+}$; 3.5MgO*0.5MgF$_2$*GeO$_2$:Mn$^{4+}$; (Ca,Sr,Ba)$_5$(PO$_4$)$_3$(F,Cl,Br,OH):Eu$^{2+}$; (Ca,Sr,Ba)Mg$_x$Al$_y$O$_{(1+x+1.5y)}$:Eu$^{2+}$, wherein x is an integer between about 1 and 5 and y is an integer between about 5 and 25; (Mg, Ca,Sr,Ba,Zn)$_2$P$_2$O$_7$:Eu$^{2+}$,Mn$^{2+}$; (Mg, Ca,Sr,Ba,Zn)$_5$(PO$_4$)$_3$(F,Cl,Br,OH):Eu$^{2+}$,Mn$^{2+}$; (Ba,Sr, Ca)$_5$(PO$_4$)$_3$(Cl,F,Br,OH):Eu$^{2+}$, Mn$^{2+}$,Sb$^{3+}$; (Ba, Sr, Ca)BPO$_5$:Eu$^{2+}$,Mn$^{2+}$; (Sr, Ca)$_{10}$(PO$_4$)$_6$*nB$_2$O$_3$:Eu$^{2+}$; (Mg, Ca,Sr,Ba,Zn)$_3$B$_2$O$_6$:Eu$^{2+}$; 2SrO*0.84P$_2$O$_5$*0.16B$_2$O$_3$:Eu$^{2+}$; Sr$_2$Si$_3$O$_8$*2SrCl$_2$:Eu$^{2+}$; Ba$_3$MgSi$_2$O$_8$:Eu$^{2+}$; Sr$_4$Al$_{14}$O$_{25}$:Eu$^{2+}$; BaAl$_8$O$_{13}$:Eu$^{2+}$; (Ba, Sr, Ca)MgAl$_{10}$O$_{17}$:Eu$^{2+}$,Mn$^{2+}$; (Ba,Sr, Ca)Al$_2$O$_4$:Eu$^{2+}$; (Y,Gd,Lu,Sc,La)BO$_3$:Ce$^{3+}$,Tb$^{3+}$; Ca$_8$Mg(SiO$_4$)$_4$Cl$_2$:Eu$^{2+}$, Mn$^{2+}$; (Ba,Sr, Ca)$_2$SiO$_4$:Eu$^{2+}$; (Ba,Sr, Ca)$_2$(Mg,Zn)Si$_2$O$_7$:Eu$^{2+}$; (Sr,Ca,Ba)(Al,Ga,In)$_2$S$_4$:Eu$^{2+}$; (Y,Gd,Tb,La,Sm,Pr, $Lu)_3(Al,Ga)_5O_{12}:Ce^{3+}$; $(Ca,Sr)_8(Mg,Zn)(SiO_4)_4Cl_2:Eu^{2+}$, $Mn^{2+}$; $Na_2Gd_2B_2O_7:Ce^{3+},Tb^{3+}$; $(Ba,Sr)_2(Ca,Mg,Zn)B_2O_6:K,Ce,Tb$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+}$, $SrY_2S_4:Eu^{2+}$; $CaLa_2S_4:Ce^{3+}$; $(Y,Lu)_2WO_6:Eu^{3+},Mo^{6+}$; $(Mg,Ca,Sr,Ba,Zn)_v(Si,Ge)_yN_{(2v/3+4y/3)}:Eu^{2+}$; $(Mg, Ca,Sr,Ba,Zn)_v(Si,Ge)_yO_zN_{(2v/3+4y/+2z/3)}:Eu^{2+}$; and $A_{2-2x}Na_{1+x}E_xD_2V_3O_{12}$, wherein A may be Ca, Ba, Sr, or combinations thereof, E may be Eu, Dy, Sm, Tm, or Er, or combinations thereof, D may be Mg or Zn, or combinations thereof and x ranges from 0.01 to 0.3.

\* \* \* \* \*